US012610766B2

(12) United States Patent
Zhang

(10) Patent No.: US 12,610,766 B2
(45) Date of Patent: Apr. 21, 2026

(54) METHOD OF PATTERNING A SEMICONDUCTOR STRUCTURE

(71) Applicant: NANYA TECHNOLOGY CORPORATION, New Taipei City (TW)

(72) Inventor: Kai Zhang, New Taipei City (TW)

(73) Assignee: NANYA TECHNOLOGY CORPORATION, New Taipei City (TW)

( * ) Notice: Subject to any disclaimer, the term of this patent is extended or adjusted under 35 U.S.C. 154(b) by 303 days.

(21) Appl. No.: 18/583,263

(22) Filed: Feb. 21, 2024

(65) Prior Publication Data

US 2025/0266264 A1 Aug. 21, 2025

(51) Int. Cl.
H10P 50/00 (2026.01)
H10P 95/90 (2026.01)

(52) U.S. Cl.
CPC .......... H10P 50/695 (2026.01); H10P 50/692 (2026.01); H10P 95/90 (2026.01)

(58) Field of Classification Search
CPC ............. H01L 21/3086; H01L 21/3081; H01L 21/324
See application file for complete search history.

(56) References Cited

U.S. PATENT DOCUMENTS

| | | | |
|---|---|---|---|
| 2016/0379837 A1* | 12/2016 | Cheng | C09D 201/00 |
| | | | 438/781 |
| 2017/0092494 A1* | 3/2017 | Zhang | H10P 76/405 |
| 2019/0221428 A1* | 7/2019 | Burns | G03F 7/0002 |
| 2019/0259612 A1* | 8/2019 | Nozawa | H10P 50/287 |
| 2021/0098287 A1* | 4/2021 | Park | H10W 20/089 |

FOREIGN PATENT DOCUMENTS

| | | |
|---|---|---|
| TW | I287284 B | 9/2007 |
| TW | I628508 B | 7/2018 |

* cited by examiner

*Primary Examiner* — Joshua L Allen
*Assistant Examiner* — Jonathan L Carter
(74) *Attorney, Agent, or Firm* — CKC & Partners Co., LLC

(57) ABSTRACT

The disclosure provides a method of patterning a semiconductor structure. A first composite substrate including first spacers on a first substrate and a second composite substrate including second spacers on a second substrate are received. The second composite substrate is disposed on the first composite substrate, in which at least one of the first spacers is in direct contact with at least one of the second spacers. Spaces between the first spacers and the second spacers are filled with a directed self-assembly material, in which the directed self-assembly material includes first portions between the first spacers and the second substrate, second portions between the second spacers and the first substrate, and third portions being remaining portions. The second composite substrate, the first spacers, and the first portions and the second portions are removed. Oxide layers are filled between the third portions. The third portions are removed.

15 Claims, 12 Drawing Sheets

<u>100</u>

A first composite substrate including first spacers on a first substrate and a second composite substrate including second spacers on a second substrate are received. — 101

The second composite substrate is disposed on the first composite substrate, in which at least one of the first spacers is in direct contact with at least one of the second spacers. — 102

Spaces between the first spacers and the second spacers are filled with a directed self-assembly material, in which the directed self-assembly material includes first portions between the first spacers and the second substrate, second portions between the second spacers and the first substrate, and third portions being remaining portions. — 103

The second composite substrate, the first spacers, and the first portions and the second portions are removed. — 104

Oxide layers are filled between the third portions. — 105

The third portions are removed. — 106

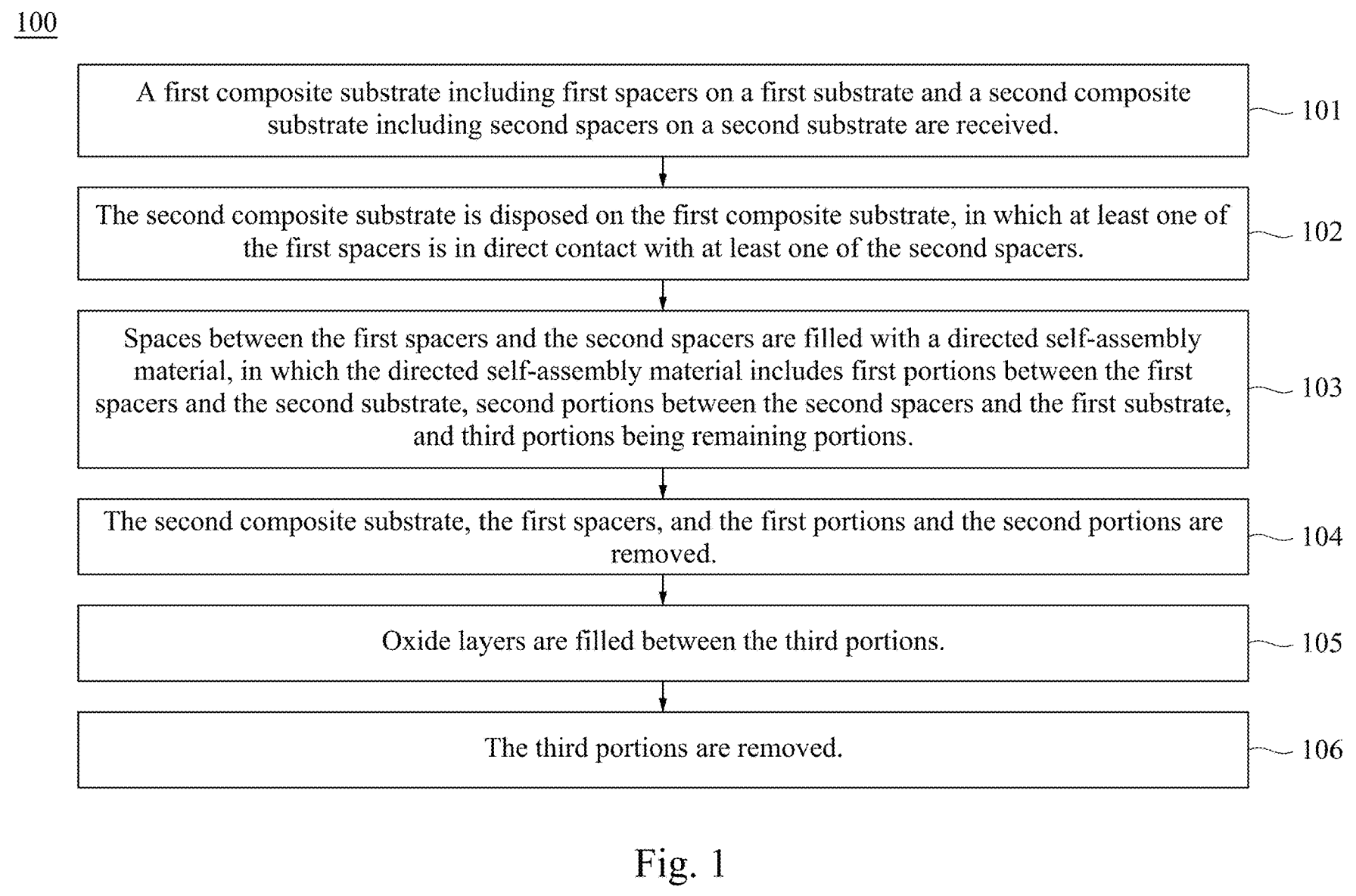

100

101

A first composite substrate including first spacers on a first substrate and a second composite substrate including second spacers on a second substrate are received.

102

The second composite substrate is disposed on the first composite substrate, in which at least one of the first spacers is in direct contact with at least one of the second spacers.

103

Spaces between the first spacers and the second spacers are filled with a directed self-assembly material, in which the directed self-assembly material includes first portions between the first spacers and the second substrate, second portions between the second spacers and the first substrate, and third portions being remaining portions.

104

The second composite substrate, the first spacers, and the first portions and the second portions are removed.

105

Oxide layers are filled between the third portions.

106

The third portions are removed.

Fig. 1

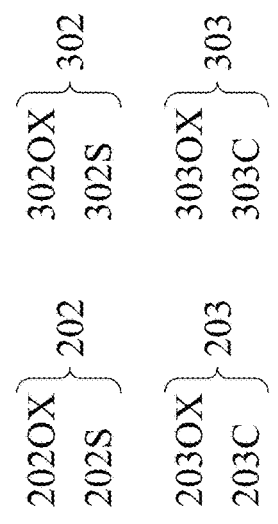
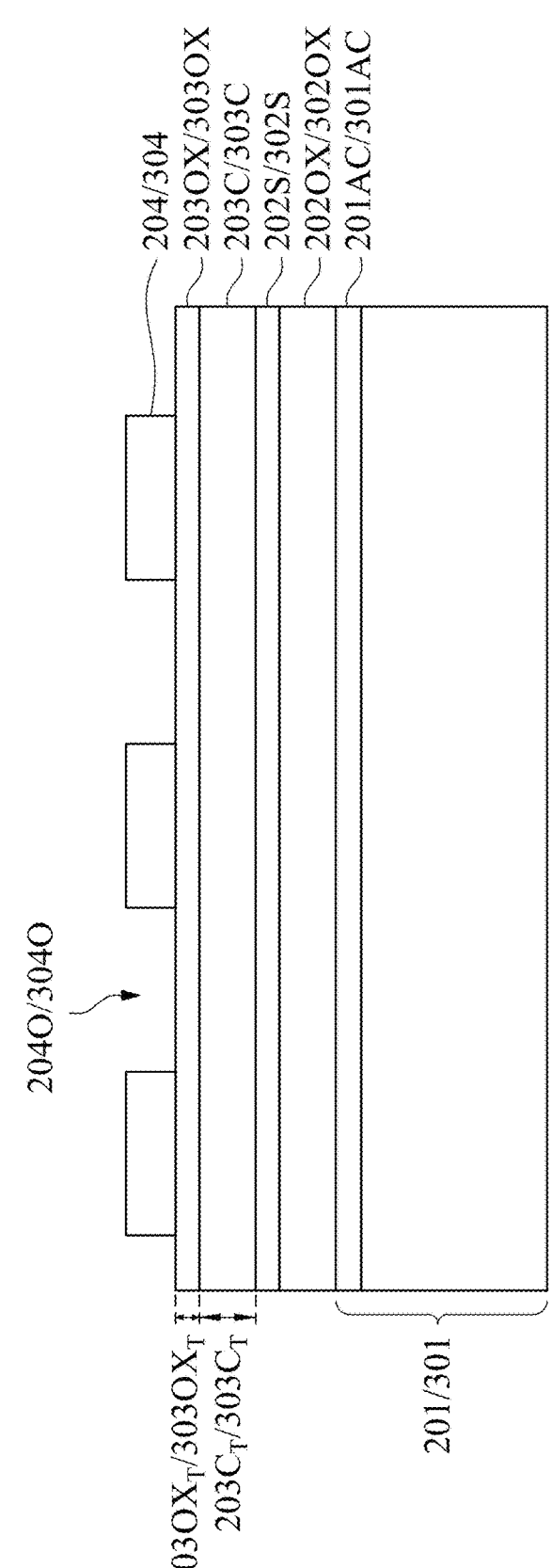
Fig. 2

203'/303'
202S/302S
202OX/302OX
201AC/301AC

203'O/303'O

202S$_T$/302S$_T$
202OX$_T$/302OX$_T$

201/301

205/305
203'/303'
202S/302S
202OX/302OX
201AC/301AC

201/301

METHOD OF PATTERNING A SEMICONDUCTOR STRUCTURE

BACKGROUND

Field of Invention

The present disclosure relates to a method of patterning a semiconductor structure.

Description of Related Art

As the size of the semiconductor device becomes smaller and smaller, the method of fabricating the elements of the semiconductor device becomes challenging. For example, conventional photolithography is limited by the wavelength of the exposure light, so the space between the patterned structures may not be small enough as desired. Besides the challenge of obtaining smaller space between the patterned structures, another challenge includes failing to avoid obtaining the patterned structures without a wiggling shape. The wiggling shape of the patterned structures may cause drawbacks to the semiconductor device, such as structural defects, increasing resistance, etc., thus affecting the performance of the semiconductor device and the subsequent fabricating process. Therefore, it is necessary to develop a method of patterning the semiconductor structure that is satisfying in every aspect.

SUMMARY

The present disclosure provides a method of patterning a semiconductor structure. The method includes the following operations. A first composite substrate and a second composite substrate are received, in which the first composite substrate includes a first substrate and first spacers on the first substrate, and the second composite substrate includes a second substrate and second spacers on the second substrate. The second composite substrate is disposed on the first composite substrate, in which at least one of the first spacers is in direct contact with at least one of the second spacers. Spaces between the first spacers and the second spacers are filled with a directed self-assembly material, in which the directed self-assembly material includes first portions, second portions, and third portions, the first portions are between the first spacers and the second substrate, the second portions are between the second spacers and the first substrate, and the third portions are remaining portions of the directed self-assembly material. The second composite substrate, the first spacers, and the first portions and the second portions of the directed self-assembly material are removed. Oxide layers are filled between the third portions of the directed self-assembly material. The third portions of the directed self-assembly material are removed.

In some embodiments, a central axis of the at least one of the first spacers that is in direct contact with the at least one of the second spacers is substantially aligned with a central axis of the at least one of the second spacers.

In some embodiments, projections of the third portions of the directed self-assembly material on the first substrate or the second substrate are complementary with projections of the first spacers and projections of the second spacers on the first substrate or the second substrate.

In some embodiments, the third portions of the directed self-assembly material are substantially equally spaced.

In some embodiments, an arrangement of the first spacers on the first substrate is substantially identical to an arrangement of the second spacers on the second substrate.

In some embodiments, the first composite substrate further includes a first anti-reflective coating layer between the first substrate and the first spacers; and the second composite substrate further includes a second anti-reflective coating layer between the second substrate and the second spacers.

In some embodiments, the first anti-reflective coating layer includes a first silicon-containing layer, and the second anti-reflective coating layer includes a second silicon-containing layer.

In some embodiments, the first spacers and the second spacers independently comprise an oxide.

In some embodiments, the directed self-assembly material includes a block copolymer.

In some embodiments, the method further includes applying a removable adhesive layer between the directed self-assembly material and the first substrate or between the directed self-assembly material and the second substrate.

In some embodiments, removing the first portions and the second portions of the directed self-assembly material includes using an etchant including $C_4F_6$, $C_4F_8$, or a combination thereof.

In some embodiments, after removing the second composite substrate, the first spacers, and the first portions and the second portions of the directed self-assembly material, the third portions of the directed self-assembly material substantially remain intact on the first substrate.

In some embodiments, removing the third portions of the directed self-assembly material includes heating the third portions of the directed self-assembly material with a temperature from 100° C. to 400° C.

In some embodiments, an average space between the oxide layers is smaller than an average space between the first spacers.

In some embodiments, an angle between a top surface and a side surface of each one of the oxide layers is from 80° to 100°.

BRIEF DESCRIPTION OF THE DRAWINGS

The present disclosure can be more fully understood by reading the following detailed description of the embodiment, with reference made to the accompanying drawings as follows:

FIG. 1 is a flow chart of a method of patterning a semiconductor structure according to some embodiments of the present disclosure;

FIGS. 2, 3, 4, 5A, 6, 7, 8, 9, and 10A are schematics of the structures during the performance of using the method to pattern the semiconductor structure according to some embodiments of the present disclosure.

DETAILED DESCRIPTION

Figure 3:
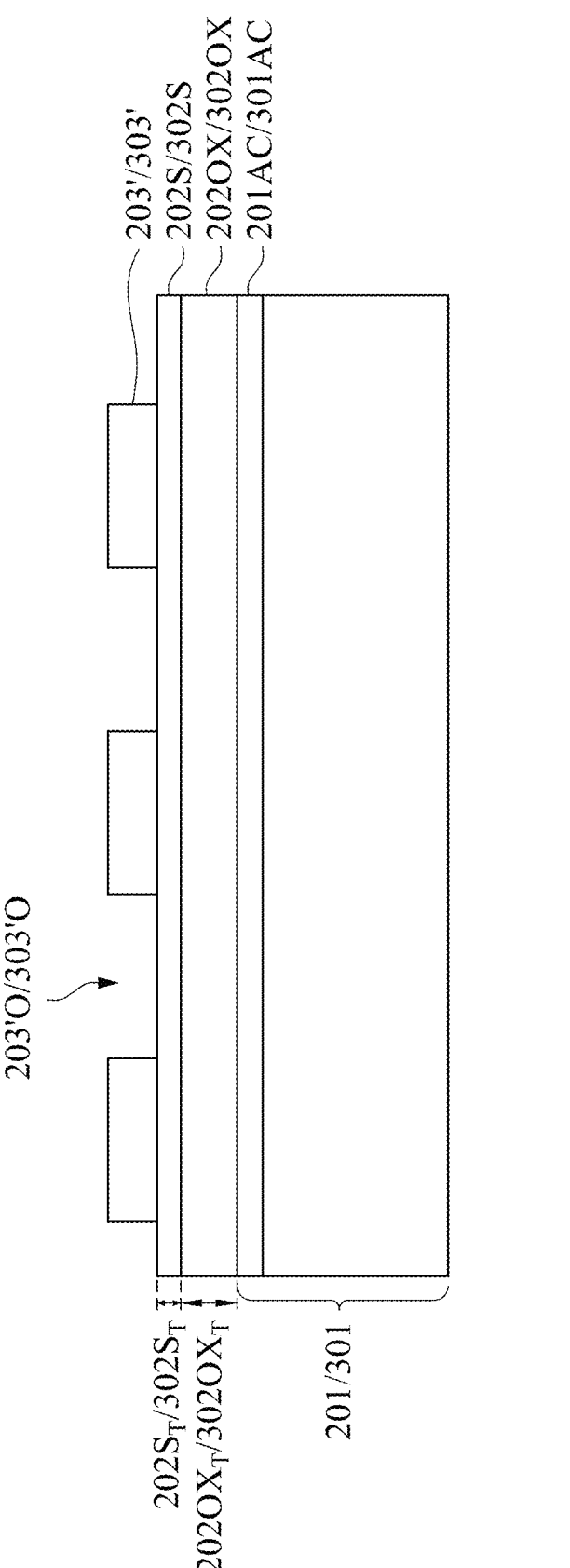

To make the description of the present disclosure more detailed and complete, the following provides an illustrative description of the aspects of the implementation and the specific embodiments of the present disclosure. The disclosure is not to limit the implementation to only one form. The embodiments of the present disclosure may be combined or substituted with each other for a beneficial circumstance, and other embodiments may be appended without further explanation.

Spatially relative terms, such as above and below, etc., may be used in the present disclosure to describe the relation of one element or feature to another element or feature in the figures. The spatially relative terms are intended to encompass different orientations of the device in use or operation in addition to the orientation depicted in the figures. For example, the device may be oriented otherwise, e.g., 90 degrees or other orientations. Therefore, the spatially relative terms in the present disclosure can be interpreted correspondingly. In addition, in the present disclosure, unless otherwise stated, the same or similar reference numbers in different figures refer to the same or similar elements formed from the same or similar materials by the same or similar methods.

The terms "about", "around", "approximately", "basically", "substantially", and so on used in the present disclosure include the stated values, characteristics, and the range of deviations from that values and characteristics that can be understood by one skilled in the art. For example, taking into account the errors of values and characteristics, the foregoing terms may include the values within one or more standard deviations (e.g., ±5%, ±10%, ±15%, ±20%, or ±30%) of the stated value, or include the deviations from the practical operations of the stated characteristics (e.g., the "substantially parallel" may be close to parallel in practice rather than an ideally perfect parallel). In addition, the acceptable range of deviations may be selected according to the measurements or other properties, and not only one kind of deviation may be applicable to all values and characteristics.

The present disclosure provides a method of patterning a semiconductor structure, as shown in FIG. 1. The method 100 includes an operation 101 to an operation 106. The operation 101 includes receiving a first composite substrate and a second composite substrate, in which the first composite substrate includes a first substrate and first spacers on the first substrate, and the second composite substrate includes a second substrate and second spacers on the second substrate. The operation 102 includes disposing the second composite substrate on the first composite substrate, in which at least one of the first spacers is in direct contact with at least one of the second spacers. The operation 103 includes filling spaces between the first spacers and the second spacers with a directed self-assembly material, in which the directed self-assembly material includes first portions, second portions, and third portions, the first portions are between the first spacers and the second substrate, the second portions are between the second spacers and the first substrate, and the third portions are remaining portions of the directed self-assembly material. The operation 104 includes removing the second composite substrate, the first spacers, and the first portions and the second portions of the directed self-assembly material. The operation 105 includes filling oxide layers between the third portions of the directed self-assembly material. The operation 106 includes removing the third portions of the directed self-assembly material. The method 100 of the present disclosure is described in detail by the embodiments provided below.

Figure 4:
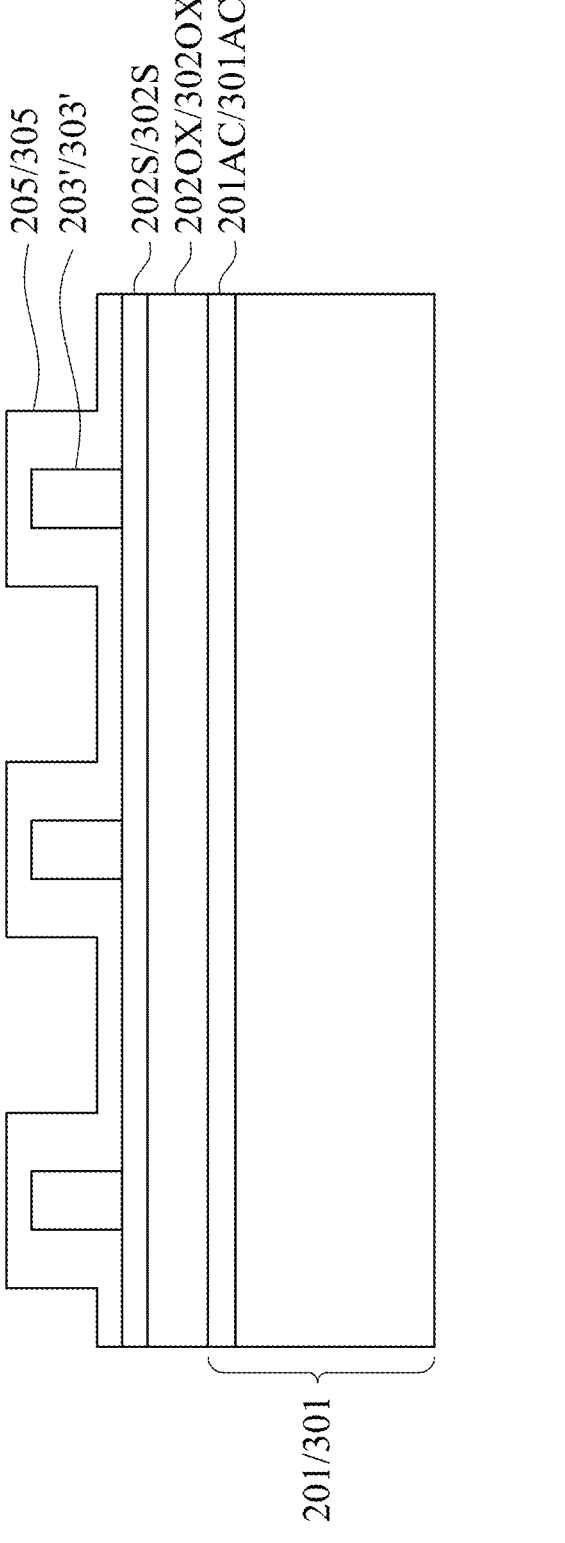
Figure 5A:
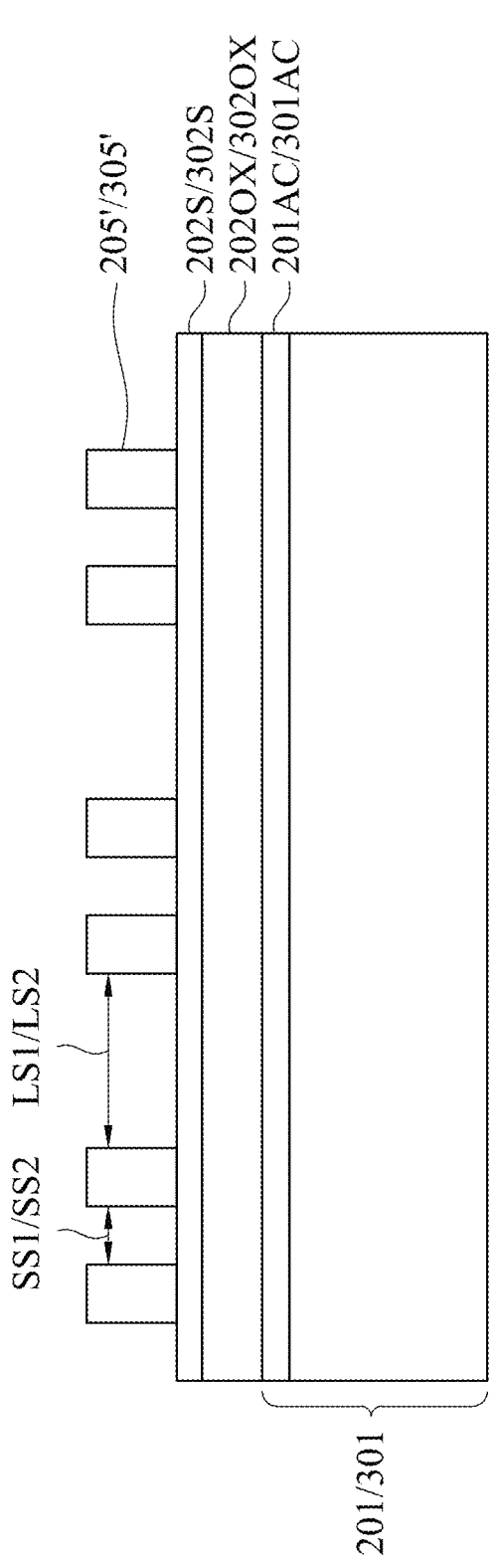

In the embodiments as provided in FIGS. 2 to 4, before receiving the first composite substrate 200 and the second composite substrate 300 as shown in FIG. 5A, the method 100 may further include forming the first composite substrate 200 and the second composite substrate 300. It is noted that the first composite substrate 200 and the second composite substrate 300 may be identical for an easier implementation of the method 100, and for the simplicity of the present disclosure, the first composite substrate 200 and the second composite substrate 300 are drawn the same in the figures. However, the first composite substrate 200 and the second composite substrate 300 may be different for any suitable application.

Continue with the embodiments of forming the first composite substrate 200 and the second composite substrate 300. In FIG. 2, the first substrate 201 and the second substrate 301 are received. The first substrate 201 and the second substrate 301 may be semiconductor substrates and may include elemental semiconductor materials (e.g., carbon, monocrystalline silicon, polycrystalline silicon, amorphous silicon, germanium, tin, sulfur, selenium, tellurium, or the like), compound semiconductor materials (e.g., silicon carbide, boron nitride, aluminum nitride, gallium nitride, gallium phosphide, gallium arsenide, indium phosphide, indium arsenide, indium antimonide, zinc oxide, or the like), alloy semiconductor materials (e.g., SiGe, AlGaAs, InGaAs, InGaP, AlInAs, GaAsP, AlGaN, InGaN, AlGaInP, or the like), or combinations thereof. In some embodiments, the first substrate 201 and the second substrate 301 may further include an active component (e.g., a diode or a transistor, etc.), a passive component (e.g., a resistor, a capacitor, or an inductor, etc.), a conductive structure (e.g., a wire, etc.), or combinations thereof. In some embodiments, the first substrate 201 may include a first amorphous carbon layer 201AC on the top, and the second substrate 301 may include a second amorphous carbon layer 301AC on the top. In some embodiments, the method 100 may further include performing an ion implantation process to the first amorphous carbon layer 201AC and the second amorphous carbon layer 301AC to form the desired doping regions of the first substrate 201 and the second substrate 301. In some embodiments, the doping agent used in the ion implantation process may be N type (e.g., including arsenic, phosphorus, or the like) or P type (e.g., including boron, gallium, or the like), depending on the design of the semiconductor structure.

Continue with the embodiments of forming the first composite substrate 200 and the second composite substrate 300. In FIGS. 2 to 3, a first hard mask layer 203 is formed on the first substrate 201, and a second hard mask layer 303 is formed on the second substrate 301. A first patterned photoresist layer 204 is formed on the first hard mask layer 203, and a second patterned photoresist layer 304 is formed on the second hard mask layer 303. The patterns of the first patterned photoresist layer 204 and the second patterned photoresist layer 304 are transferred to the first hard mask layer 203 and the second hard mask layer 303 to form the first patterned hard mask layer 203' and the second patterned hard mask layer 303' by etching the portions of the first hard mask layer 203 and the second hard mask layer 303 that are exposed by the openings 2040 of the first patterned photoresist layer 204 and the openings 3040 of the second patterned photoresist layer 304. The etching method may be any suitable method, for example, a plasma etching, and so on.

For more details, the first patterned photoresist layer 204 and the second patterned photoresist layer 304 may be formed by any suitable photolithography method. In some embodiments, the first patterned photoresist layer 204 and the second patterned photoresist layer 304 may independently include a positive photoresist or a negative photoresist. In addition, the first hard mask layer 203 and the second hard mask layer 303 may have higher etch resistance than the first patterned photoresist layer 204 and the second patterned photoresist layer 304, so the patterns transferred from the first patterned photoresist layer 204 and the second patterned photoresist layer 304 to the first hard mask layer 203 and the second hard mask layer 303 substantially remain identical in the first patterned hard mask layer 203' and the second patterned hard mask layer 303'. For example, the width of the openings 2040 of the first patterned photoresist layer 204 is substantially the same as the width of the openings 203'O of the first patterned hard mask layer 203', and the width of the openings 3040 of the second patterned photoresist layer 304 is substantially the same as the width of the openings 303'O of the second patterned hard mask layer 303'. In some embodiments, a preferable first hard mask layer 203 includes an oxide layer 2030X disposed on a carbon layer 203C, and a preferable second hard mask layer 303 includes an oxide layer 3030X disposed on a carbon layer 303C, in which a thickness 203CT of the carbon layer 203C is larger than a thickness 2030XT of the oxide layer 2030X, and a thickness 303CT of the carbon layer 303C is larger than a thickness 3030XT of the oxide layer 3030X. In some embodiments, preferable thickness ratios of the carbon layer 203C to the oxide layer 2030X and the carbon layer 303C to the oxide layer 3030X are independently from 1.7 to 5, for example, 1.7, 2.0, 2.5, 3, 3.5, 4.0, 4.5, or 5, in which 2.0 to 4.0 is more preferable. In some embodiments, a preferable thickness 203CT of the carbon layer 203C and a preferable thickness 303CT of the carbon layer 303C are independently from 50 nm to 70 nm (e.g., 50 nm, 55 nm, 60 nm, 65 nm, or 70 nm), and a preferable thickness 2030XT of the oxide layer 2030X and a preferable thickness 3030XT of the oxide layer 3030X are independently from 10 nm to 30 nm (e.g., 10 nm, 15 nm, 20 nm, 25 nm, or 30 nm). The oxide layer 2030X and the oxide layer 3030X may be etched completely in the formation of the first patterned hard mask layer 203' and the second patterned hard mask layer 303', so the formed first patterned hard mask layer 203' and second patterned hard mask layer 303' may substantially include the carbon layer 203C and the carbon layer 303C and exclude the oxide layer 2030X and the oxide layer 3030X.

Continue with the embodiments of forming the first composite substrate 200 and the second composite substrate 300. In some embodiments, a first anti-reflective coating layer 202 and a second anti-reflective coating layer 302 may form on the first substrate 201 and the second substrate 301, such that the first hard mask layer 203 is formed on the first anti-reflective coating layer 202 and the second hard mask layer 303 is formed on the second anti-reflective coating layer 302. The first anti-reflective coating layer 202 and the second anti-reflective coating layer 302 reduce the reflective light during the photolithographic process of forming the first patterned photoresist layer 204 and the second patterned photoresist layer 304, so the formed first patterned photoresist layer 204 and second patterned photoresist layer 304 may have patterns closer to the desired patterns, which is beneficial for forming smaller patterns (e.g., forming the smaller widths of the openings 2040 and the openings 3040). The first anti-reflective coating layer 202 and the second anti-reflective coating layer 302 in combination with the first spacers 205' and the second spacers 305' discussed later may provide surrounding environments for the directed self-assembly material 402 discussed later to self-assemble into at least two different regions (e.g., the first portions 402A and the second portions 402B of the present disclosure in one kind of region that is easier to be etched, and the third portions 402C of the present disclosure in another kind of region that is more resistant to be etched). Specifically, different surrounding environments contribute different affinities to the directed self-assembly material 402 to form at least two different regions in the present disclosure, in which the at least two different regions of the present disclosure include at least two different alignments of the block copolymer that is present in the directed self-assembly material 402. In the embodiments including the first anti-reflective coating layer 202 and the second anti-reflective coating layer 302, the at least two different alignments of the block copolymer are much different to enhance the resolution of patterning the directed self-assembly material 402. Details of patterning the directed self-assembly material 402 are provided in the following disclosure.

For more details, in some embodiments, a preferable first anti-reflective coating layer 202 includes a first silicon-containing layer 202S disposed on an oxide layer 2020X, and a preferable second anti-reflective coating layer 302 includes a second silicon-containing layer 302S disposed on an oxide layer 3020X, in which a thickness 2020XT of the oxide layer 2020X is larger than a thickness 202ST of the first silicon-containing layer 202S, and a thickness 3020XT of the oxide layer 3020X is larger than a thickness 302ST of the second silicon-containing layer 302S. In some embodiments, preferable thickness ratios of the oxide layer 2020X to the first silicon-containing layer 202S and the oxide layer 3020X to the second silicon-containing layer 302S are independently from 1.5 to 5, for example, 1.5, 2.0, 2.5, 3, 3.5, 4.0, 4.5, or 5, in which 1.5 to 2.5 is more preferable. In some embodiments, a preferable thickness 2020XT of the oxide layer 2020X and a preferable thickness 3020XT of the oxide layer 3020X are independently from 15 nm to 25 nm (e.g., 15 nm, 20 nm, or 25 nm), and a preferable thickness 202ST of the first silicon-containing layer 202S and a preferable thickness 302ST of the second silicon-containing layer 302S are independently from 5 nm to 15 nm (e.g., 5 nm, 10 nm, or 15 nm). In the embodiments including the first anti-reflective coating layer 202 and the second anti-reflective coating layer 302, portions of the first silicon-containing layer 202S of the first anti-reflective coating layer 202 are exposed by the openings 203'O of the first patterned hard mask layer 203', and portions of the second silicon-containing layer 302S of the second anti-reflective coating layer 302 are exposed by the openings 303'O of the second patterned hard mask layer 303'.

Figure 5B:
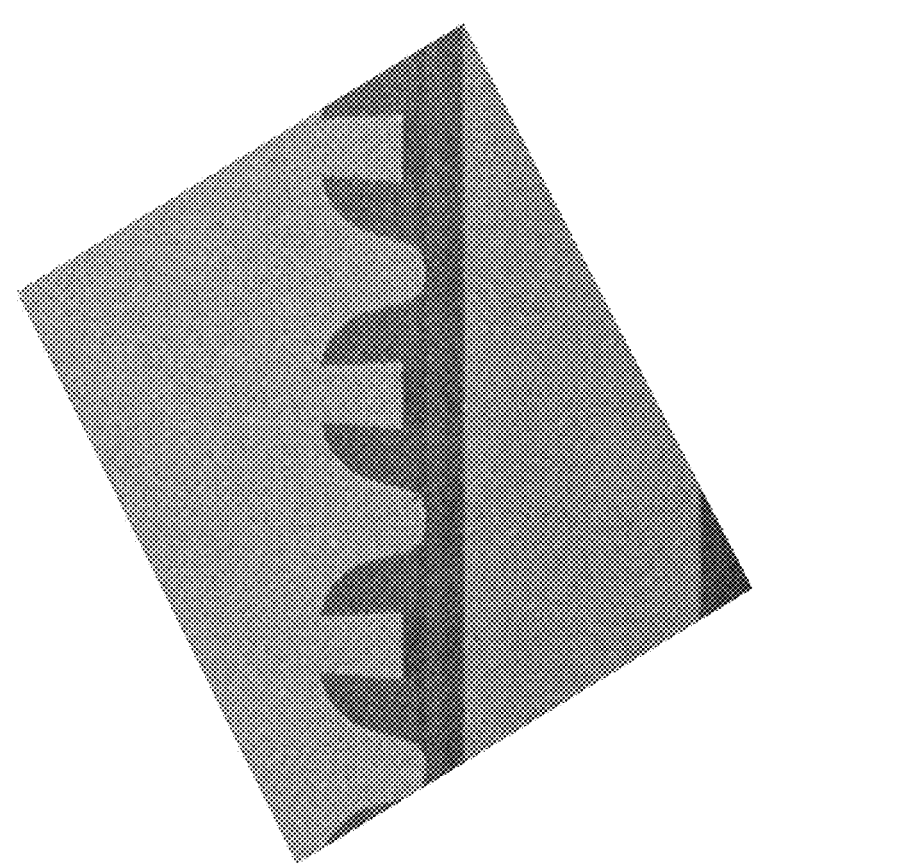
FIGS. 5B and 10B are electron microscopic images of the structures relating to the structures of FIGS. 5A and 10A, respectively, according to some embodiments of the present disclosure.

Continue with the embodiments of forming the first composite substrate 200 and the second composite substrate 300. In FIGS. 4 to 5A, a first spacer material 205 is deposited conformally on the first patterned hard mask layer 203' and in the openings 203'O of the first patterned hard mask layer 203', and a second spacer material 305 is deposited conformally on the second patterned hard mask layer 303' and in the openings 303'O of the second patterned hard mask layer 303'. In some embodiments, the deposition method may be any suitable method, for example, an atomic layer deposition (ALD), and so on. In some embodiments, the first spacer material 205 and the second spacer material 305 independently include oxide, for example, silicon oxide (e.g., silicon dioxide). The deposited first spacer material 205 and second spacer material 305 may be etched back by any suitable method to remain the portions on the sidewalls of the separated patterns of the first patterned hard mask layer 203' and the second patterned hard mask layer 303'. The remaining portions of the first spacer material 205 and the second spacer material 305 are referred to as the first spacers 205' and the second spacers 305', respectively. Next, the first patterned hard mask layer 203' and the second patterned hard mask layer 303' are removed to form the first composite substrate 200 and the second composite substrate 300. In some embodiments, the removing method may be any suitable method, for example, a wet etching process or a dry etching process.

After forming the first composite substrate 200 and the second composite substrate 300, the first composite substrate 200 and the second composite substrate 300 shown in FIG. 5A are received in the operation 101. In FIG. 5A, the spaces between the first spacers 205' may include first larger spaces LS1 and first smaller spaces SS1, in which the first larger spaces LS1 are larger than the first smaller spaces SS1, and the spaces between the second spacers 305' may include second larger spaces LS2 and second smaller spaces SS2, in which the second larger spaces LS2 are larger than the second smaller spaces SS2. Specifically, the positions of the first larger spaces LS1 correspond to the positions of the openings 203'O of the first patterned hard mask layer 203', and the positions of the first smaller spaces SS1 correspond to the positions of the first patterned hard mask layer 203', so an average space (i.e., an average of the first larger spaces LS1 and the first smaller spaces SS1) of the patterns of the first spacers 205' is smaller than an average space (i.e., the widths of the openings 203'O) of the patterns of the first patterned hard mask layer 203'. Similarly, the positions of the second larger spaces LS2 correspond to the positions of the openings 303'O of the second patterned hard mask layer 303', and the positions of the second smaller spaces SS2 corresponds to the positions of the second patterned hard mask layer 303', so an average space (i.e., an average of the second larger spaces LS2 and the second smaller spaces SS2) of the patterns of the second spacers 305' is smaller than an average space (i.e., the widths of the openings 303'O) of the patterns of the second patterned hard mask layer 303'. Although the spaces of the patterns are reduced, the shapes of the patterns of the first spacers 205' and the second spacers 305' may not be satisfying. As shown in the electron microscopic image of FIG. 5B, the shapes of the first spacers 205' (and the second spacers 305') are wiggling, in which the surfaces of the first spacers 205' (and the second spacers 305') are significantly curved.

Figure 6:
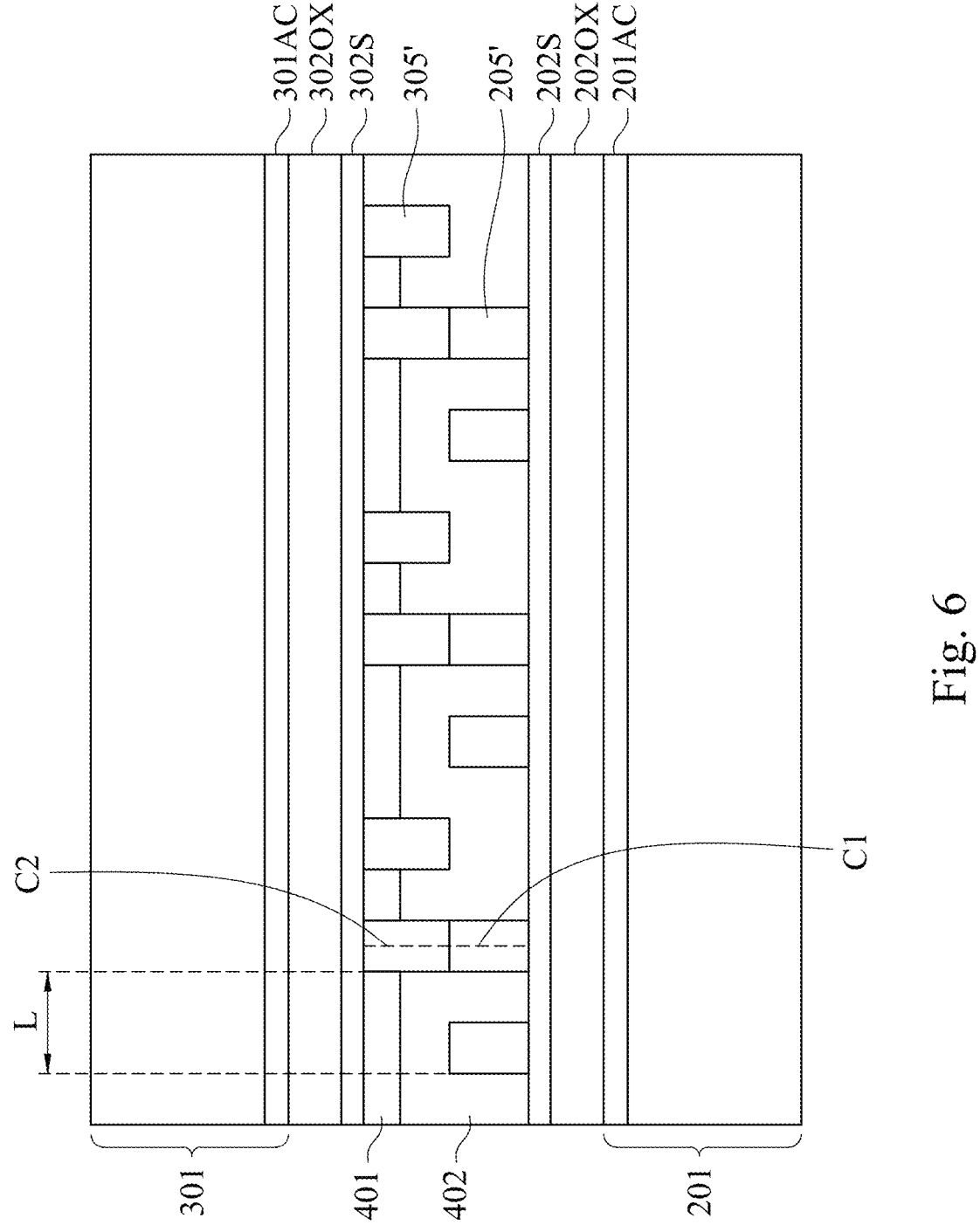

In the embodiments as provided in FIG. 6, the second composite substrate 300 is disposed on the first composite substrate 200 in the operation 102, for example, by turning the second composite substrate 300 upside down to face the first composite substrate 200, such that at least one of the first spacers 205' is in direct contact with at least one of the second spacers 305'. In some embodiments, some portions of the second spacers 305' may be in direct contact with the first spacers 205' and some portions of the first spacers 205' and the second spacers 305' may not be in direct contact with each other and separated from each other. In some embodiments, the central axis C1 of the at least one of the first spacers 205' that is in direct contact with the at least one of the second spacers 305' is substantially aligned with the central axis C2 of the at least one of the second spacers 305'. In some embodiments, the arrangement of the first spacers 205' on the first substrate 201 is substantially identical to the arrangement of the second spacers 305' on the second substrate 301. In the embodiments that the arrangement of the first spacers 205' is identical to the arrangement of the second spacers 305', the second spacers 305' shift from the first spacers 205' with a distance L that is equal to the width of a single one of the first smaller spaces SS1 plus the width of a single one of the first spacers 205'. In some embodiments, the second composite substrate 300 may combine with the first composite substrate 200 by any suitable method, for example, a thermal binding process, bonding by reducing pressure between the second composite substrate 300 and the first composite substrate 200, and so on. In some embodiments, a removable adhesive layer 401 may be formed on the second composite substrate 300 (e.g., on the second anti-reflective coating layer 302) or on the first composite substrate 200 (e.g., on the first anti-reflective coating layer 202) to provide adhesion between the second composite substrate 300 and the first composite substrate 200. In some embodiments, the removable adhesive layer 401 may release the second composite substrate 300 from the first composite substrate 200 by any suitable method including mechanical peeling, laser lift-off, heating, applying pressure, and so on. In some embodiments, the removable adhesive layer 401 may be any suitable removable adhesive, for example, a silicone based adhesive, a fluorinated silicone based adhesive, an acrylic based adhesive, or the like.

Figure 7:
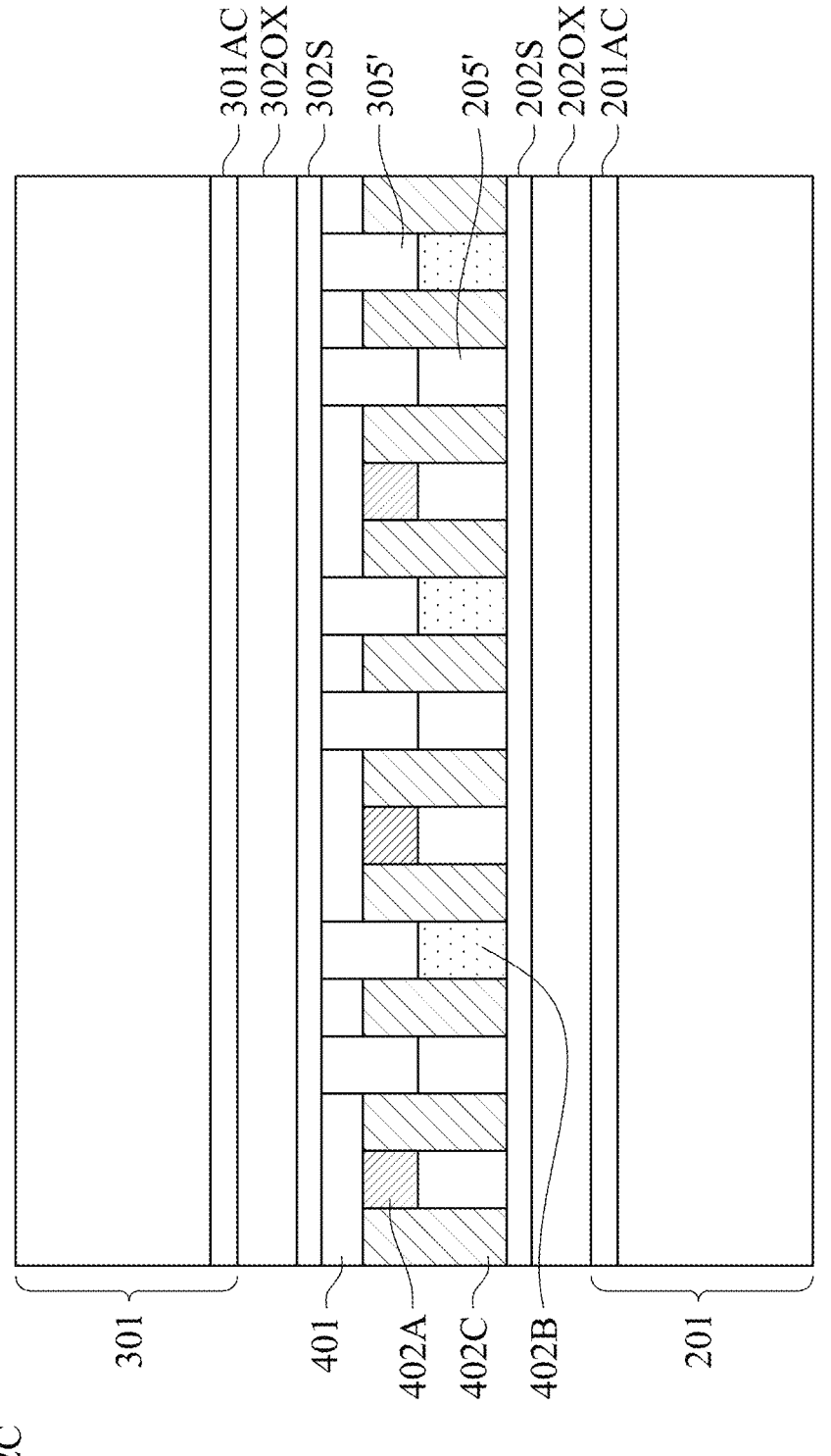

In the embodiments as provided in FIGS. 6 and 7, after the operation 102, the spaces (or the exposed regions) between the first spacers 205' and the second spacers 305' are filled with the directed self-assembly material 402 in the operation 103. Since the first spacers 205' and the second spacers 305' are dislocated, the spaces between the first spacers 205' and the second spacers 305' may be surrounded by different combinations of the elements. In some embodiments, depending on the surrounding elements, the directed self-assembly material 402 may include at least two different regions that have obviously different etching resistances, in which one region is referred to as the first portions 402A and the second portions 402B in the present disclosure, and another region is referred to as the third portions 402C in the present disclosure. Specifically, the first portions 402A are between the first spacers 205' and the second substrate 301, the second portions 402B are between the second spacers 305' and the first substrate 201, and the third portions 402C are remaining portions of the directed self-assembly material 402. Since the affinities of the first portions 402A and the second portions 402B to their surrounding elements are much different from the affinity of the third portions 402C to their surrounding elements, the directed self-assembly material 402 aligned differently in the first portions 402A and the second portions 402B compared with in the third portions 402C. In some embodiments, the affinity of the third portions 402C to their surrounding elements is larger than the affinities of the first portions 402A and the second portions 402B to their surrounding elements. In some embodiments, the directed self-assembly material 402 may include a block copolymer that includes at least two different blocks of polymerized monomers, for example, a block polymer of polystyrene and poly(methyl methacrylate), or the like. In some embodiments, the method 100 may further include heating the directed self-assembly material 402, applying voltage on the directed self-assembly material 402, or by any suitable method to further promote the alignment of the directed self-assembly material 402.

For more details, the projections of the third portions 402C on the first substrate 201 (or on the second substrate 301) are complementary (or nor overlapped) with the projections of the first spacers 205' and the projections of the second spacers 305' on the first substrate 201 (or on the second substrate 301). In the embodiments as provided in FIG. 7, the third portions 402C are substantially equally spaced.

Figure 8:
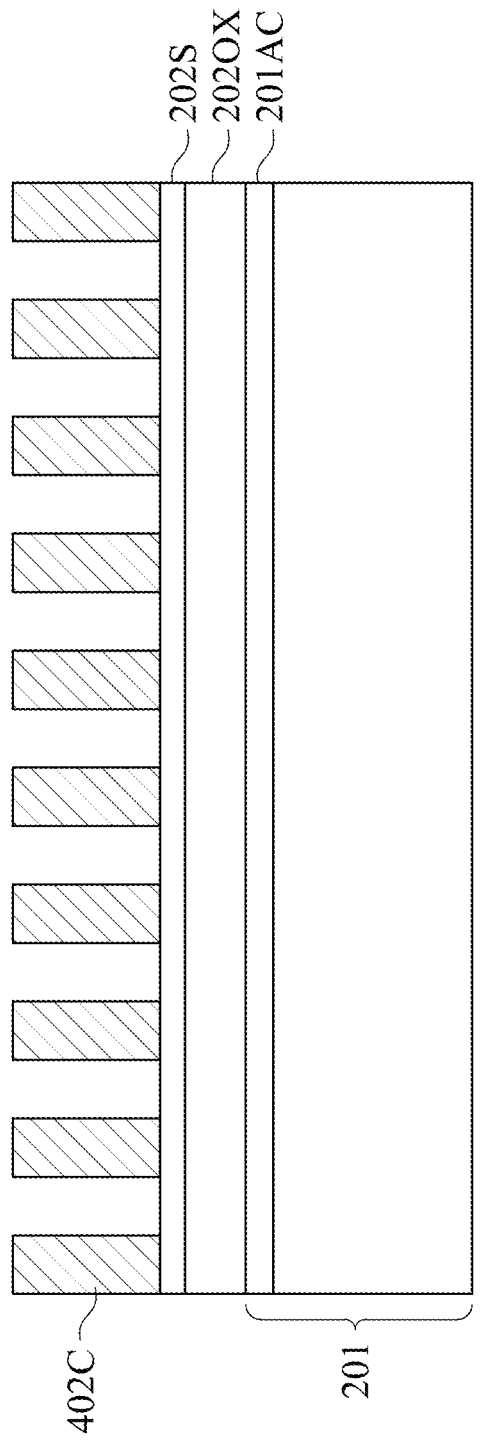

In the embodiments as provided in FIG. 8, the second composite substrate 300 (may also include the second anti-reflective coating layer 302 in some embodiments) is removed from the first composite substrate 200 in the operation 104. The removing method may be any suitable method, for example, by the removable adhesive layer 401 in some embodiments. Next, the first spacers 205', the first portions 402A, and the second portions 402B may be removed together in the operation 104, for example, by etching with $C_4F_6$, $C_4F_8$, or a combination of $C_4F_6$ and $C_4F_8$. Since the affinity of the third portions 402C to the surrounding elements is larger than the affinities of the first portions 402A and the second portions 402B to the surrounding elements, after removing the first portions 402A and the second portions 402B, the third portions 402C substantially remain intact on the first substrate 201.

Figure 9:
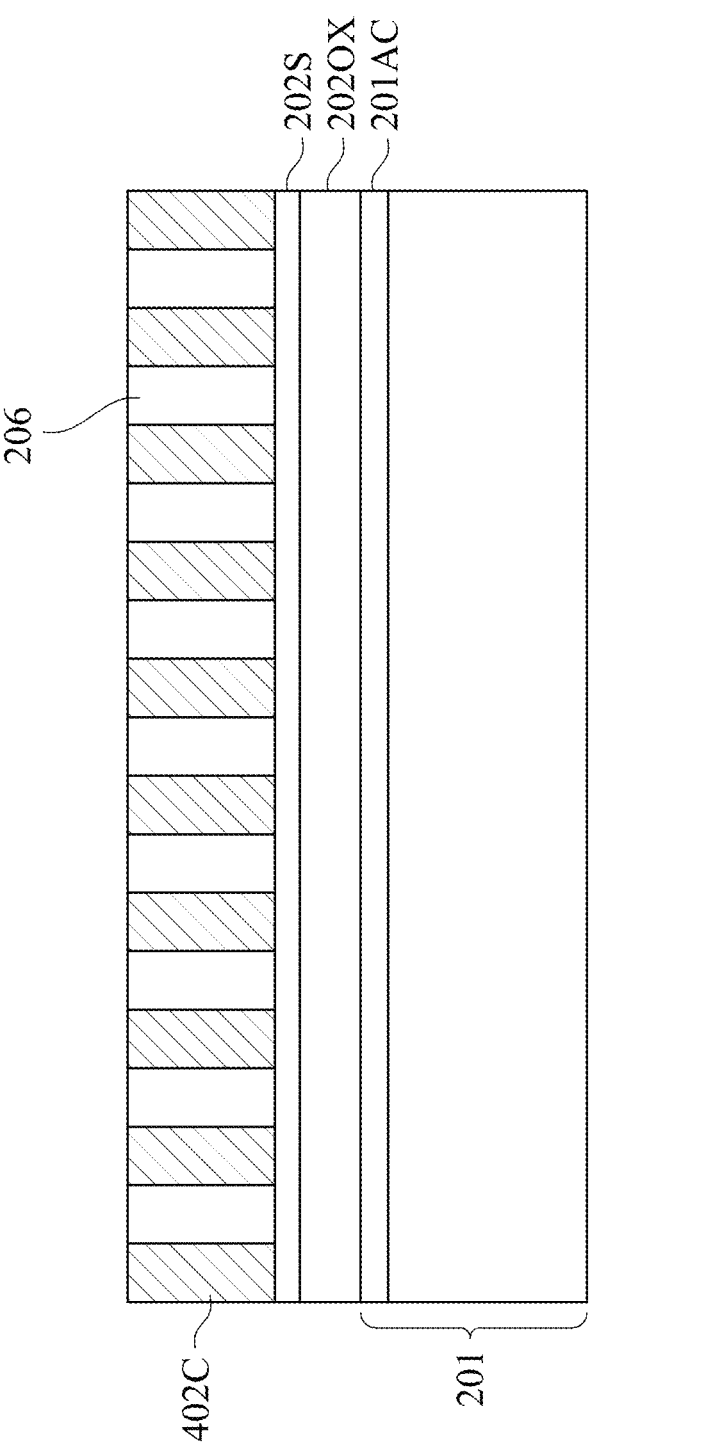
Figure 10A:
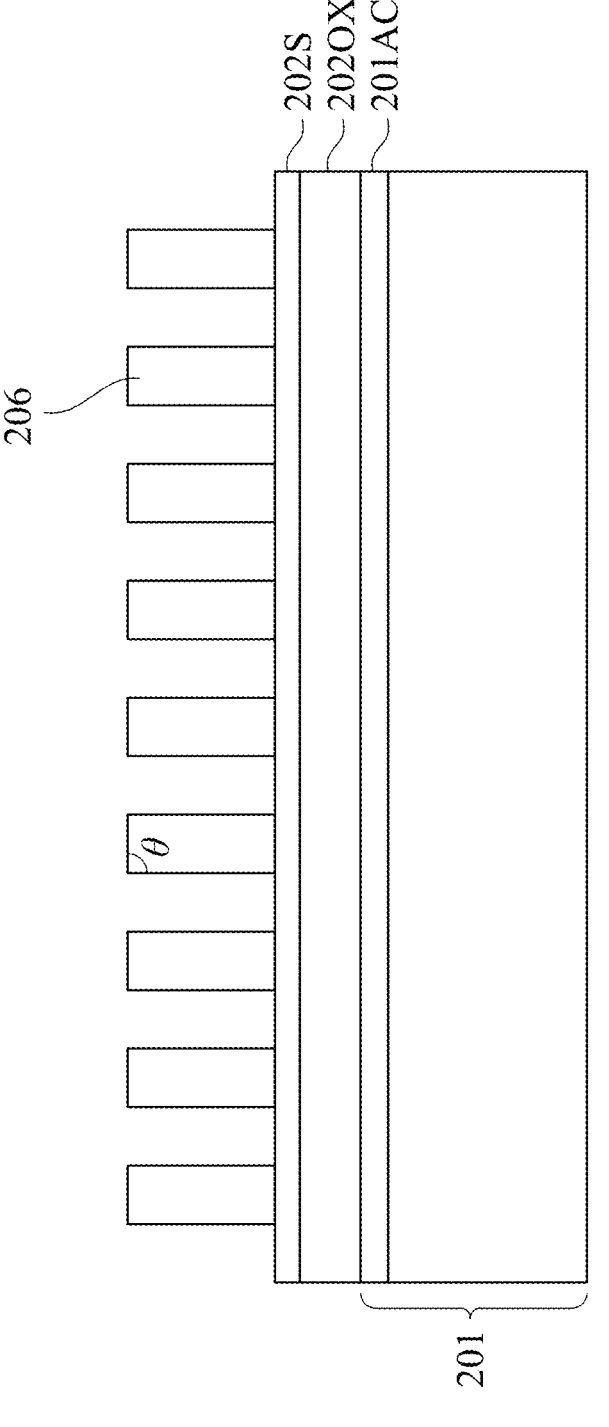
Figure 10B:
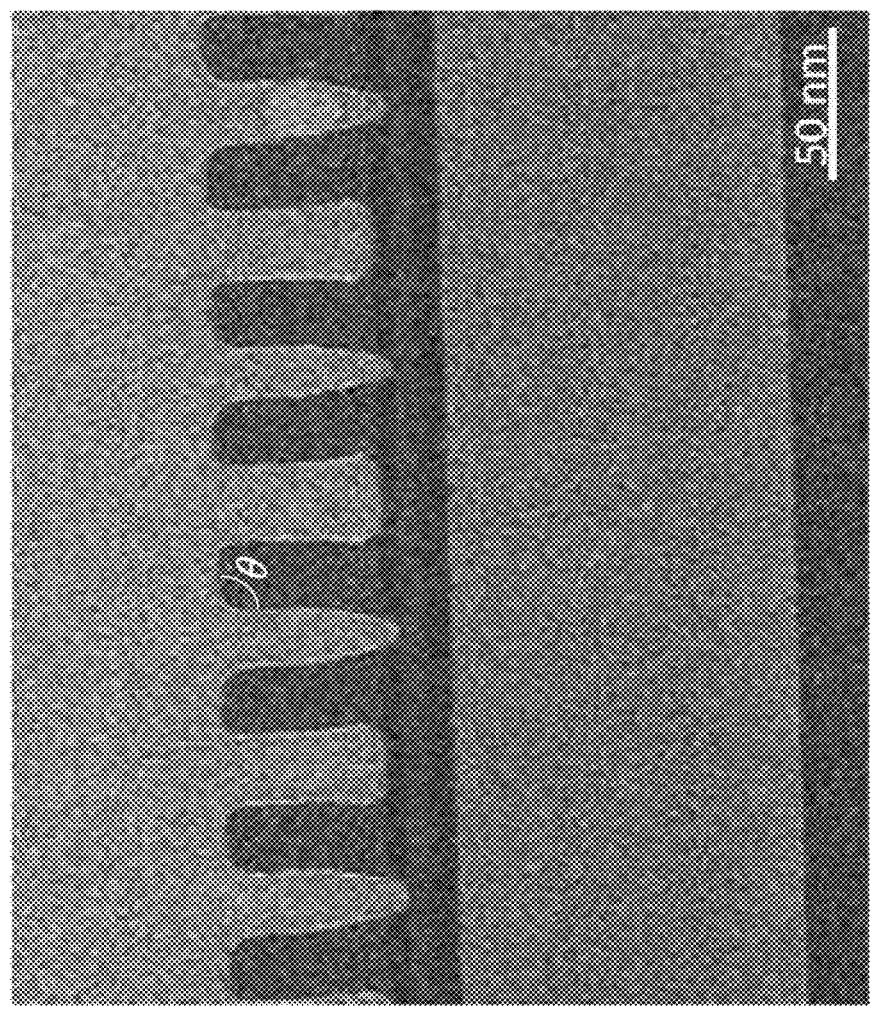

In the embodiments as provided in FIGS. 9 and 10A, after the operation 104, oxide layers 206 are filled between the third portions 402C in the operation 105, and the third portions 402C are removed to remain the oxide layers 206 in the operation 106. In some embodiments, the oxide layers 206 include silicon dioxide. In some embodiments, filling the oxide layers 206 may include any suitable deposition method, for example, a chemical vapor deposition. In some embodiments, removing the third portions 402C of the directed self-assembly material 402 includes heating the third portions 402C with a temperature from 100° C. to 400° C., for example, 100° C., 150° C., 200° C., 250° C., 300° C., 350° C., or 400° C. After the operation 106, an average space between each one of the oxide layers 206 is smaller than an average space between each one of the first spacers 205'. Referring to FIG. 7, the third portions 402C of the directed self-assembly material 402 may form in the positions corresponding to the positions of both the first smaller spaces SS1 and the first larger spaces LS1 between the first spacers 205'. The third portions 402C of the directed self-assembly material 402 formed in the positions corresponding to the positions of the first larger spaces LS1 may be separated by the second portions 402B of the directed self-assembly material 402. Therefore, the third portions 402C of the directed self-assembly material 402 may be a mask for forming the oxide layers 206 with a smaller average space. In some embodiments, the average space between the oxide layers 206 is smaller than 50 nm. In some embodiments, the oxide layers 206 are equally spaced. In some embodiments, substantially all the edges of the oxide layers 206 are close to right angles (e.g., the angle θ between the top surface and the side surface of each one of the oxide layers 206 is from 80° to 100° or more preferably from 85° to) 95° and the oxide layers 206 substantially have no wiggle shapes, as shown in the electron microscopic image of FIG. 10B, which are much better than those of the first spacers 205' shown in the electron microscopic image of FIG. 5B. After the operation 106, the patterns of the oxide layers 206 with smaller spaces and linear shapes may be transferred to the layers beneath the oxide layers 206 or may be used as a mask for any application in the subsequent processes.

The method of patterning the semiconductor structure of the present disclosure can form patterns with much smaller spaces. In addition, the quality of the patterns is improved, for example, by reducing the wiggling of the patterns and by increasing the similarity of each one of the patterns. Therefore, the improved patterns can apply to smaller semiconductor devices and have more applicability to different manufacturing processes.

The present disclosure is described in detail with some embodiments, but other embodiments may be applicable. Therefore, the description of the embodiments in the present disclosure should not be used to limit the scope and spirit of the appended claims.

For one skilled in the art, modifications and changes to the present disclosure may be made without departing from the scope and spirit of the present disclosure. The present disclosure is intended to cover the foregoing modifications and changes as long as such modifications and changes are within the scope and spirit of the appended claims.

What is claimed is:

1. A method of patterning a semiconductor structure, comprising:

receiving a first composite substrate and a second composite substrate, wherein the first composite substrate comprises a first substrate and first spacers on the first substrate, and the second composite substrate comprises a second substrate and second spacers on the second substrate;

disposing the second composite substrate on the first composite substrate, wherein at least one of the first spacers is in direct contact with at least one of the second spacers;

filling spaces between the first spacers and the second spacers with a directed self-assembly material, wherein the directed self-assembly material comprises first portions, second portions, and third portions, the first portions are between the first spacers and the second substrate, the second portions are between the second spacers and the first substrate, and the third portions are remaining portions of the directed self-assembly material;

removing the second composite substrate, the first spacers, and the first portions and the second portions of the directed self-assembly material;

filling oxide layers between the third portions of the directed self-assembly material; and removing the third portions of the directed self-assembly material.

2. The method of claim 1, wherein a central axis of the at least one of the first spacers that is in direct contact with the at least one of the second spacers is substantially aligned with a central axis of the at least one of the second spacers.

3. The method of claim 1, wherein projections of the third portions of the directed self-assembly material on the first substrate or the second substrate are complementary with projections of the first spacers and projections of the second spacers on the first substrate or the second substrate.

4. The method of claim 1, wherein the third portions of the directed self-assembly material are substantially equally spaced.

5. The method of claim 1, wherein an arrangement of the first spacers on the first substrate is substantially identical to an arrangement of the second spacers on the second substrate.

6. The method of claim 1, wherein:

the first composite substrate further comprises a first anti-reflective coating layer between the first substrate and the first spacers; and the second composite substrate further comprises a second anti-reflective coating layer between the second substrate and the second spacers.

7. The method of claim 6, wherein:

the first anti-reflective coating layer comprises a first silicon-containing layer; and the second anti-reflective coating layer comprises a second silicon-containing layer.

8. The method of claim 1, wherein the first spacers and the second spacers independently comprise an oxide.

9. The method of claim 1, wherein the directed self-assembly material comprises a block copolymer.

10. The method of claim 1, further comprising applying a removable adhesive layer between the directed self-assembly material and the first substrate or between the directed self-assembly material and the second spacers.

11. The method of claim 1, wherein removing the first portions and the second portions of the directed self-assembly material comprises using an etchant comprising $C_4F_6$, $C_4F_8$, or a combination thereof.

12. The method of claim 1, wherein after removing the second composite substrate, the first spacers, and the first portions and the second portions of the directed self-assembly material, the third portions of the directed self-assembly material substantially remain intact on the first substrate.

13. The method of claim 1, wherein removing the third portions of the directed self-assembly material comprises heating the third portions of the directed self-assembly material with a temperature from 100° C. to 400° C.

14. The method of claim 1, wherein an average space between the oxide layers is smaller than an average space between the first spacers.

15. The method of claim 1, wherein an angle between a top surface and a side surface of each one of the oxide layers is from 80° to 100°.

* * * * *